United States Patent [19]
Reddy

[11] Patent Number: 5,231,318

[45] Date of Patent: Jul. 27, 1993

[54] DIFFERENTIAL LATCH SENSE AMPLIFIER

[76] Inventor: Chitranjan N. Reddy, 1848 Country Club Dr., Milpitas, Calif. 95035

[21] Appl. No.: 883,898

[22] Filed: May 11, 1992

Related U.S. Application Data

[63] Continuation of Ser. No. 562,616, Aug. 3, 1990, abandoned.

[51] Int. Cl.⁵ .................. H03F 3/45; H03K 19/02
[52] U.S. Cl. .................................. 307/530; 307/451; 307/473; 307/272.1
[58] Field of Search ............... 307/443, 448, 451, 473, 307/530, 272.1

[56] References Cited

U.S. PATENT DOCUMENTS

| | | | |
|---|---|---|---|
| 4,910,714 | 3/1990 | Hartgring | 307/473 |
| 4,939,392 | 7/1990 | Shubat et al. | 307/473 |
| 4,973,864 | 11/1990 | Nogami | 307/530 |

Primary Examiner—John S. Heyman
Assistant Examiner—Margaret Rose Wambach
Attorney, Agent, or Firm—Limbach & Limbach

[57] ABSTRACT

A differential latch sense amplifier circuit uses a differential amplifier to isolate the input signal nodes from the output driver nodes. The latch circuit provides the necessary speed and level shifting to drive the next stage. This, coupled with a tristate driver circuit, makes the zero power sense amplifier capable of driving large capacitances with tristatability.

10 Claims, 4 Drawing Sheets

DIFFERENTIAL LATCH SENSE AMPLIFIER

This is a continuation of co-pending application Ser. No. 562,616, filed on Aug. 3, 1990 now abandoned.

BACKGROUND OF THE INVENTION

1. Field of the Invention

The present invention relates to semiconductor memories and, in particular, to use of a CMOS differential latch with a tristate buffer to create a sense amplifier with optimum speed and power with tristatability.

2. Discussion of the Prior Art

A sense amplifier detects low-level signals received from the cells of a memory array and converts these signals to levels compatible with the rest of the system in which the memory is used.

As memory density increases, the memory cell size and the corresponding cell output signal is reduced, thereby making the sense amplifier critical for high speed applications. The sense amplifier should be highly sensitive and still meet the speed requirements of the high density memories.

A conventional sense amplifier detects the memory cell output through a differential amplifier, which is highly sensitive, but has very small voltage gain. The sense amplifier requires a biasing circuit which burns static power and is also supply voltage and process sensitive.

Figure 1:
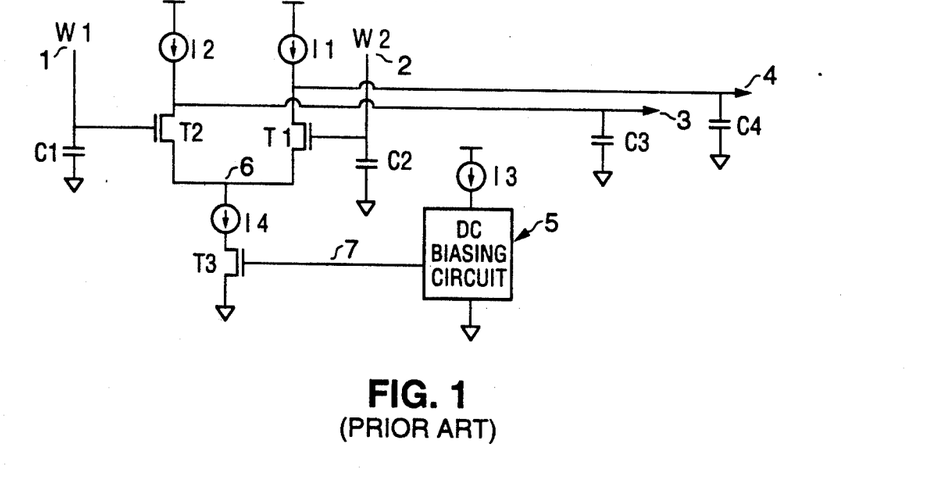
FIG. 1 is a schematic diagram illustrating a conventional differential sense amplifier.

FIG. 1 shows a conventional differential sense amplifier of the type generally used in most CMOS VLSI memory circuits. The differential sense amplifier includes n-channel transistors T1 and T2 which comprise a differential pair and n-channel transistor T3 which is a biasing transistor driven by biasing circuit 5. Currents I1 and I2 are the supply currents for the differential pair transistors T1 and T2, respectively. Node 7 of transistor T3 is biased in such a way that the voltage at node 6 is maintained at an optimum voltage to optimize speed and sensitivity.

As further shown in FIG. 1, input signals W1 and W2 are applied to the respective input nodes 1 and 2 of the differential amplifier. The input nodes 1 and 2 are capacitively decoupled from the output driver nodes 3 and 4, which have large capacitive loads C3 and C4, respectively.

The biasing circuit 5 is a static circuit, which takes DC power. Its output voltage, which is provided at node 7, is dependent upon supply voltage and process parameters which in turn control the voltage at node 6.

Figure 2:
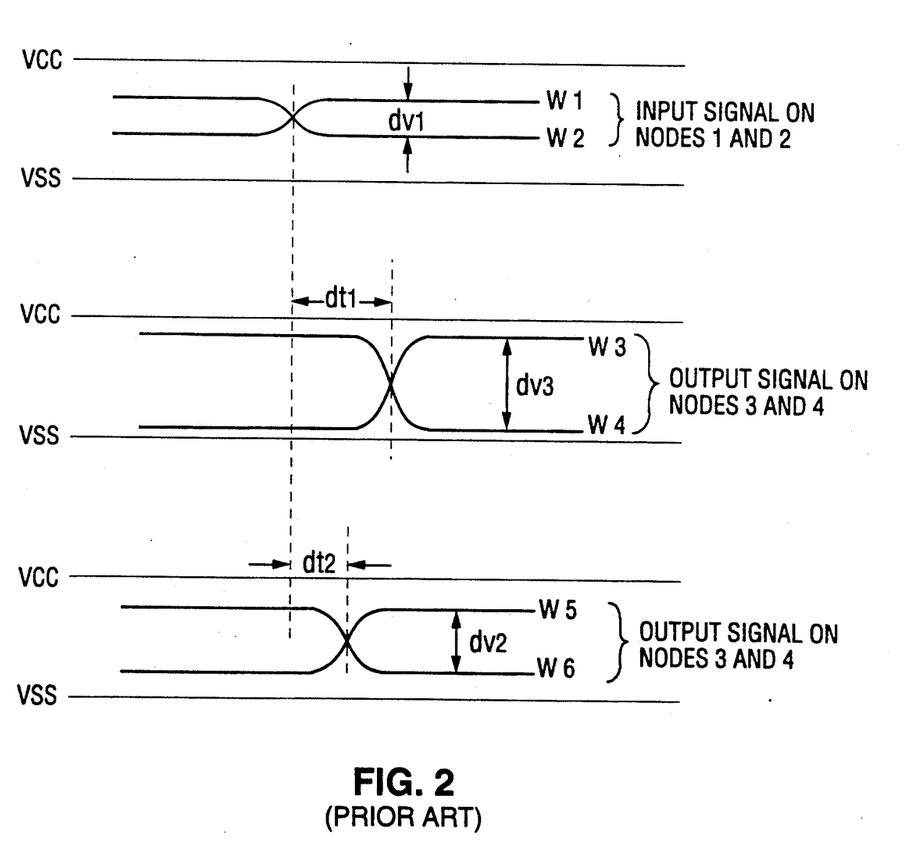
FIG. 2 is a timing diagram illustrating the input and output waveforms of the differential sense amplifier shown in FIG. 1.

Referring concurrently to the FIG. 1 schematic diagram and its associated FIG. 2 signal waveforms, during the operation of the FIG. 1 circuit, input signals W1 and W2 are applied to the low capacitance input nodes 1 and 2; the output nodes 3 and 4 can be either W3 and W4 or W5 and W6 depending upon the voltage at node 6. The lower the node 6 voltage, the higher the voltage gain; however, it will be slower (as W3 and W4). On the other hand, when the node 6 voltage is higher, i.e., close to the input signal levels, the sense amplifier will be very sensitive but have smaller voltage gain (as W5 and W6).

For the case where the output signal W3 and W4 on nodes 3 and 4, respectively, is larger, but slower by dt1 compared to output signal W5 and W6, where the output signal (W5 and W6) is smaller, but faster by dt2 as indicated.

Thus, it is clear that there is a tradeoff between the signal delay in the differential amplifier to the voltage gain (differential output voltage/differential input voltage). As stated above, this trade-off is primarily controlled by the voltage at node 6, which in turn is controlled by biasing circuit 5 through biasing transistor T3. This indicates that any biasing voltage fluctuations clearly impact the voltage gain as well as the input to output delay in the differential sense amplifier.

It can also be seen from both the high gain, less sensitive and the low gain, very sensitive cases that the output signal pairs W3, W4 and W5, W6 will never reach full rail supply voltages. When these signals drive the next stage, DC power will be burned, which further increases the DC standby or active power.

SUMMARY OF THE INVENTION

The present invention provides a differential latch sense amplifier which has the same small signal sensitivity as a conventional differential sense amplifier, but does not use any biasing circuitry and provides much larger voltage gain. The differential latch sense amplifier provides a zero power sense amplifier with much faster sensing speed driving large capacitance loads.

The differential latch sense amplifier of the present invention uses a differential amplifier to isolate the input signal nodes from the output driver nodes. The latch circuit provides the necessary speed and level shifting to drive the next stage. This, coupled with a tristate driver circuit makes the zero power sense amplifier capable of driving large capacitances with tristatability.

The differential latch sense amplifier can be clocked or fully static, depending upon the application, with very little impact on speed. The differential latch sense amplifier has zero active or standby power, except switching current.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 3:
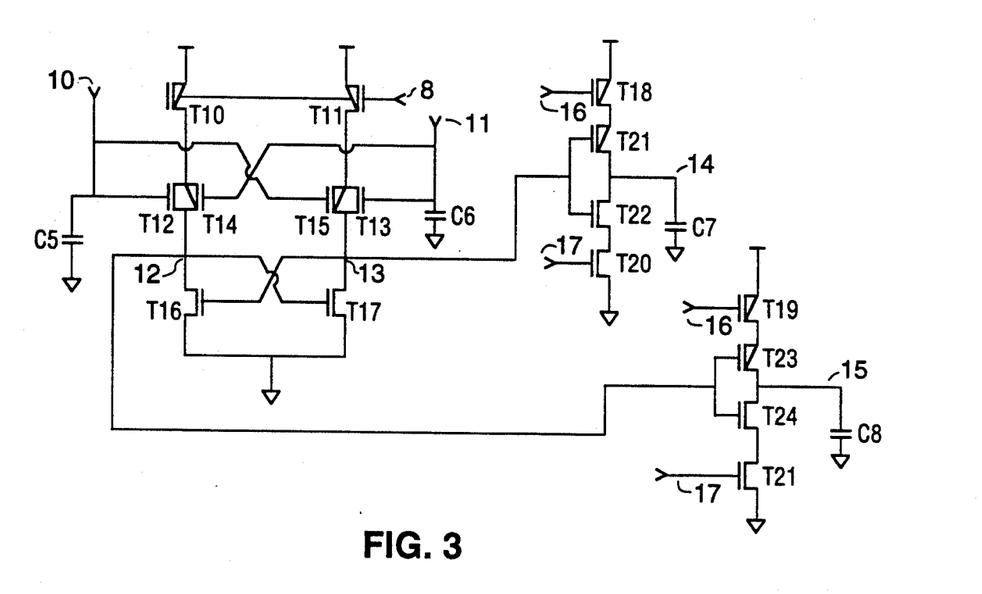
FIG. 3 is a schematic diagram illustrating a differential latch sense amplifier in accordance with the present invention.

FIG. 3 shows a differential latch sense amplifier in accordance with the present invention. In the FIG. 3 circuit, input signals 10 and 11 are amplified onto output nodes 13 and 12, respectively. The output signals at output nodes 13 and 12 are in turn further amplified onto the high capacitance nodes 14, 15, respectively, through respective tristate buffers (T18, T21, T22, T20 and T19, T23, T24, T21).

N-channel transistors T12, T13 and p-channel transistors T14, T15 act as differential pairs which provide voltage gain ($VN_{out}/VN_{in}$) and the capacitance decoupling required from the input nodes 10 and 11 to the output nodes 12 and 13.

The cross-coupled latch circuit comprising n-channel transistors T16 and T17 provides the biasing for differential pairs T12, T13 and T14, T15 and also the large signal gain due to the nature of the cross-coupling.

Figure 4:
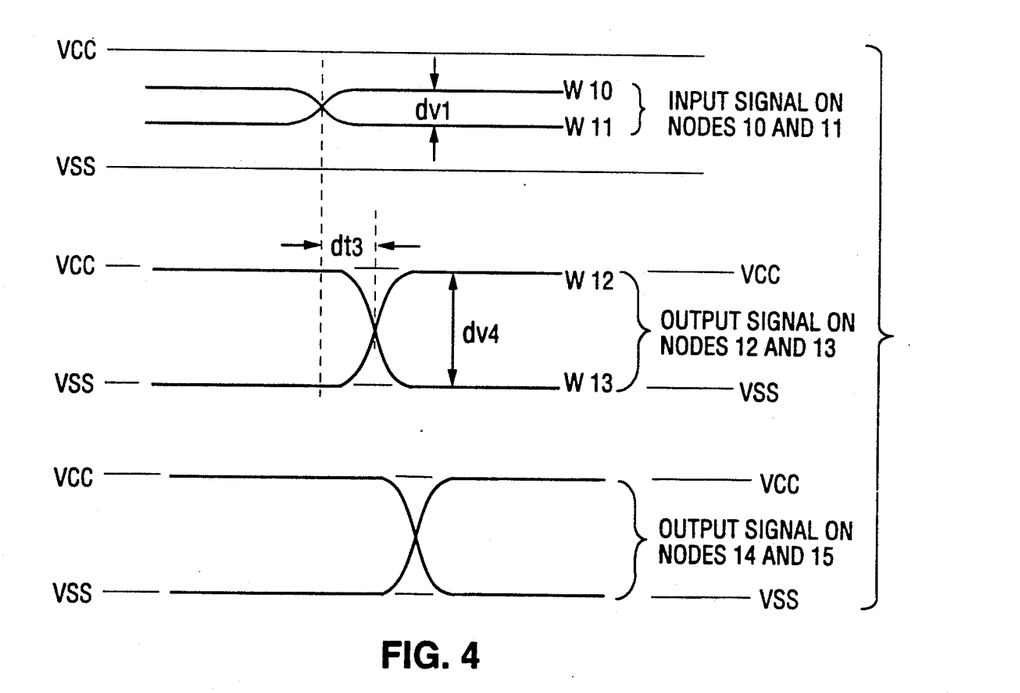
FIG. 4 is a timing diagram illustrating the input and output waveforms of the differential latch sense amplifier shown in FIG. 3.

The sizes of biasing transistors T16 and T17 must be ratioed properly with respect to the differential pairs T12, T13 and T14, T15 to optimize delay dt3 and the voltage levels W12, W13, as shown in the FIG. 4 waveforms.

P-channel power on transistors T10 and T11 provide the necessary decoding and supply power to the differential latch.

The outputs at nodes 14 and 15 of the differential latch circuit are connected to a tristated driver circuit, as shown in FIG. 3, to drive large capacitive loads C8 and C7. This tristate driver circuit can be used for multiplexing with very little delay and also for providing maximum drive for large capacitance loads like C7 and C8. In this tristate driver, voltages W12 and W13 are applied to driver gates comprising p-channel transistor T21 in combination with n-channel transistor T22 and p-channel transistor T23 in combination with n-channel transistor T24, which provide the voltage gain and driver capability to drive loads C7 and C8, respectively.

The power supplied to the tristate driver is supplied through p-channel transistor T18 and n-channel transistor T20 and p-channel transistor T19 and n-channel T21. These power supply gates are decoded, so that power can be turned down to selected gates and so that nodes 14 and 1 5 can be common to any number of the tristated driver circuits. Also, gates T15, T14 and T12, T13 serve as a differential amplifier in addition to bringing the voltage levels on nodes 12 and 13 to ground and power supply levels. These CMOS levels, in turn, drive the tristated inverters (T21, T22 and T23, T24) which should not burn any DC power.

Referring to the FIG. 4 waveforms, it can be seen from the operation of the FIG. 3 circuit, that there is no DC current after the initial access. Furthermore, the input voltages on nodes 10 and 11 are isolated from the sensing nodes 12 and 13, making the circuit less susceptible to supply voltages and providing high speed. The added tristatability of the driver nodes 14 and 15 make them useful in multiplexed bussing.

Figure 5A:
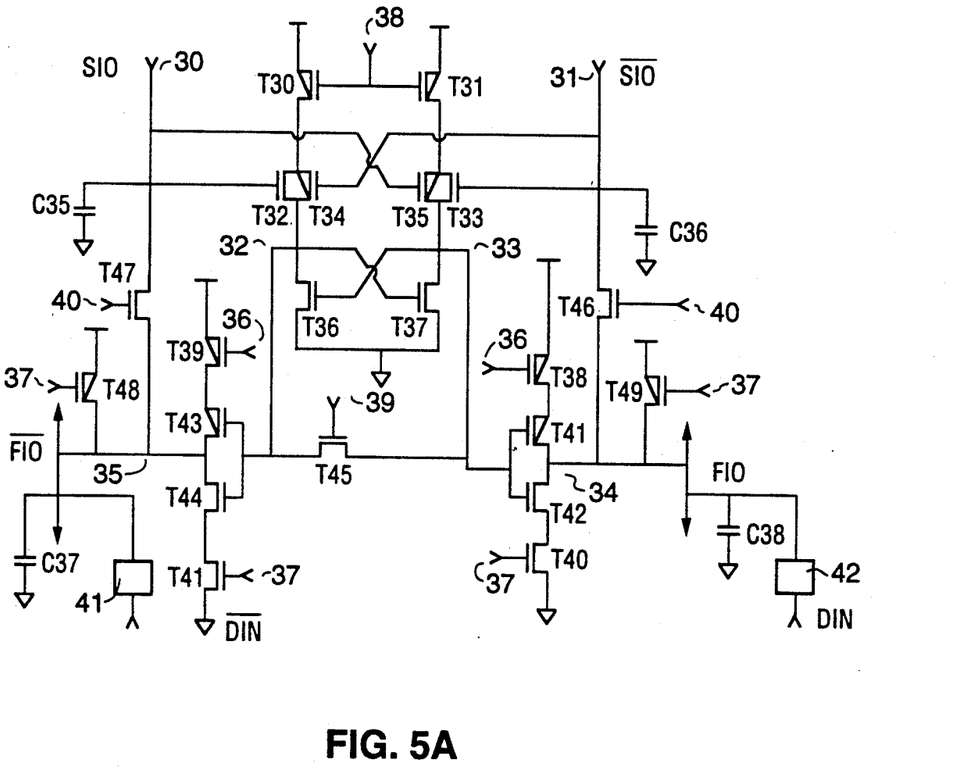
FIG. 5A is a clocked differential latch in accordance with the present invention.

An alternative embodiment of a differential latch sense amplifier in accordance with the invention is shown in FIG. 5A. Its associated signal waveforms are shown in FIG. 5B.

Figure 5B:
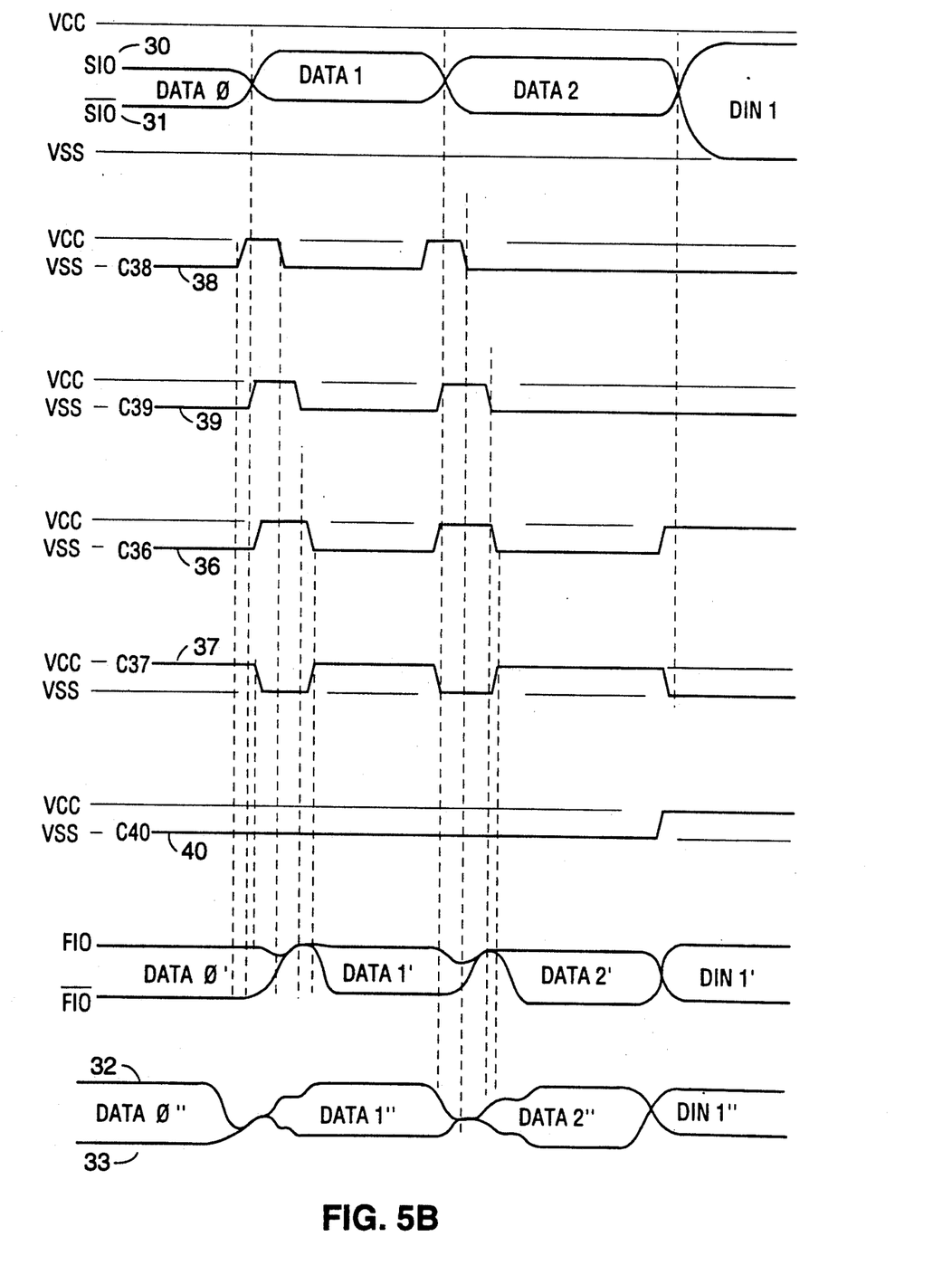
FIG. 5B is a timing diagram illustrating the clock waveforms corresponding to the differential latch shown in FIG. 5A.

Referring concurrently to FIGS. 5A and 5B, during read and write, the clock timing waveforms of FIG. 5B (C36, C37, C38, C39 and C40) are applied to nodes 36, 37, 38, 39 and 40, respectively, of FIG. 5A. Just before the proper data is applied on the SIO (secondary IO) and $\overline{SIO}$ lines, the node voltages on nodes 38, 36 and 39 are high and nodes 37 and 40 are low. This, in turn, disables the sense amplifier, discharge nodes 32 and 33 to ground and precharges nodes 35 and 34 to VCC through transistors T48 (n-channel) and T49 (p-channel).

After the input voltages on nodes 30 and 31 reach proper differential, the sense amplifier clocks C38 and C39 are turned on to show proper polarity. This quickly results in generation of a large signal on nodes 32 and 33. After proper differential voltages on nodes 32 and 33 are generated, the tristate buffers are turned on using clocks C36 and C37. This causes one of the FIO and $\overline{FIO}$ lines to discharge to ground quickly, providing the large signal on the highly capacitive nodes 34 and 35.

During writing, data is written onto the FIO and $\overline{FIO}$ lines by the tristated data-in buffers 42 and 41, respectively. During this time, clock C40 is enabled and all other clocks (C36, C37) are disabled, thereby writing the data on the FIO and $\overline{FIO}$ lines onto the SIO and $\overline{SIO}$ lines through the pass gates T47 and T46, respectively.

Also, in the FIG. 5A embodiment, shorting n-channel transistor T45 is used to preset the sensing nodes 32 and 33 to ground during read, thereby eliminating the time required to switch these nodes with respect to the input signal on lines SIO and $\overline{SIO}$.

As can be seen from the FIG. 5A embodiment, data is read and written from the same bus (FIO and $\overline{FIO}$), thereby eliminating separate read data lines and write data lines.

It should be understood that various alternatives to the embodiments of the invention described herein may be employed in practicing the invention. It is intended that the following claims define the scope of the invention and that methods and apparatus within the scope of these claims and their equivalents be covered thereby.

What is claimed is:

1. A differential latch sense amplifier circuit comprising:
   a differential latch that includes first and second cross-coupled differential gates for isolating respective first and second input signals from second and first sensing nodes, respectively, the first differential gate including a first p-channel transistor having its gate connected to receive the first input signal, its source coupled to a power supply and its drain connected to the first sensing node and a first n-channel transistor having its gate connected to receive the second input signal, its drain coupled to the power supply and its source coupled to the first sensing node, the second differential gate including a second p-channel transistor having its gate connected to receive the second input signal, its source coupled to the power supply and its drain connected to the second sensing node and a second n-channel transistor having its gate connected to receive the first input signal, its drain coupled to the power supply and its source coupled to the second sensing node; and
   a cross-coupled latch connected to the first and second sensing nodes for providing gain to first and second sense signals appearing at the first and second sensing nodes, respectively.

2. A differential gate sense amplifier as in claim 1 wherein the first differential gate is coupled to the power supply via a first switch and the second differential gate is coupled to the power supply via a second switch, and wherein the first and second switches respond to at power-on signal by providing power from the power supply to the first and second differential gates, respectively.

3. A differential latch sense amplifier as in claim 1 and further including power-on means connected between the power supply and the first and second cross-coupled differential gates and responsive to a power-on signal for supplying power to the differential latch sense amplifier.

4. A differential latch sense amplifier circuit comprising (a) a differential latch for isolating first and second input signal form second and first sensing nodes, respectively, the differential latch comprising a first differential gate comprising a first p-channel transistor having tis gate connected to receive a first input signal and a first n-channel transistor having its gate connected to receive a second input signal, and a second differential gate comprising a second p-channel transistor having tis gate connected to receive the second input signal and a second n-channel transistor having tis gate connected to receive the first input signal;

(b) a cross-coupled latch for providing gain to first and second sense signals appearing at the first and second sensing nodes, respectively, the cross-coupled latch comprising a third n-channel transistor connected between the first sensing node and a negative supply and having its gate connected to the second sensing node, and a fourth n-channel transistor connected between the second sensing node;

(c) a third p-channel transistor connected between the first differential gate and a power supply and responsive t a power-on signal connected to its gate for providing power to the first differential; and (d) a fourth p-channel transistor connected between the second differential gate ad the power supply and responsive to the power-on signal connected to its gate for providing power to the second differential gate.

5. A clocked differential latch sense amplifier circuit comprising:

(a) a differential latch comprising first and second cross-coupled differential gates for isolating respective first and second input signals from second and first sensing nodes respectively;

(b) a cross-coupled latch connected to the first and second sensing nodes of the differential latch for providing gain to the first and second sense signals appearing at the first and second sensing nodes respectively;

(c) power-on means connected between a power supply and the first and second cross-coupled differential gates and responsive to a first clock signal for supplying power to the differential latch sense amplifier;

(d) a first tristate buffer connected between the first sensing node and a first output node; and (e) a second tristate buffer connected between the second sensing node and second output node, both the first tristate buffer and the second tristate buffer being responsive to second and third complementary clock signals for transferring the respective signals appearing at the first and second sensing node to the first and second output nodes, respectively.

6. A clocked differential latch sense amplifier circuit as in claim 5 further comprising first and second precharge gates connected between the power supply and the first and second output nodes, respectively, both the first and the second pre-charge gate being responsive to the third clock signal.

7. A clocked differential latch sense amplifier circuit as in claim 6 and further comprising a shorting gate connected between the first and second sensing nodes and responsive to a fourth clock signal for increasing the sensing speed of the clocked differential latch sense amplifier circuit.

8. A clocked differential sense amplifier circuit as in claim 7 and further comprising a first pass gate connected between the first output node and the second cross-coupled gate, and a second pass gate connected between the second output node and the first cross-coupled gate, the first and second pass gates being responsive to a fifth clock signal such that when the fifth clock signal is enabled and the first, second, third and fourth clock signals are disabled, data is written from first and second data input means via the respective first and second output nodes to the second and first cross-coupled gates, respectively, whereby the first and second output nodes serve as common read and write lines during read and write timing, respectively.

9. A differential latch sense amplifier circuit comprising:

(a) a differential latch comprising first and second cross-coupled differential gates for isolating respective first and second input signals from second and first sensing nodes, respectively;

(b) a cross-coupled latch connected to the second and first sensing nodes of the differential latch for providing gain to the respective sense signals appearing at the sensing nodes;

(c) power-on means connected between a power supply and the first and second cross-coupled differential gates and responsive to a power-on signal for supplying power to the differential latch sense amplifier;

(d) a first tristate buffer connected between the first sensing nodes and a first output node; and (e) a second tristate buffer connected between the second sensing node and a second output node.

10. A differential latch sense amplifier circuit comprising (a) a differential latch for isolating first and second input signals from second and first sensing nodes respectively, the differential latch comprising a first differential gate comprising a first p-channel transistor having tis gate connected to receive a first input signal and a first n-channel transistor having its gate connected to receive a second input signal, and a second differential gate comprising a second p-channel transistor having its gate connected to receive the second input signal and a second n-channel transistor having its gate connected to receive the first input signal;

(b) a cross-coupled latch for providing gain to first and second sense signals appearing at the first and second sensing nodes, respectively, the cross-coupled latch comprising a third n-channel transistor connected between the first sensing node and a negative supply and having its gate connected to the second sensing node, and a fourth n-channel transistor connected between the second sensing node and the negative supply and having its gate connected to the first sensing node;

(c) a first tristate buffer connected between the first sensing node and a first output node, the first tristate buffer comprising fifth and sixth series-connected p-channel transistors connected between the power supply and the first output node, the gate of the fifth p-channel transistor connected to receive a first drive signal, the gate of the sixth p-channel transistor connected to receive the first sense signal applied to the first sense node, and fifth and sixth series-connected n-channel transistors connected between the first output node and the negative supply, the gate of the fifth n-channel transistor connected to receive the first sense signal, the gate to the sixth n-channel transistor connected to receive a second drive signal; and (d) a second tristate buffer connected between the second sensing node and a second output node, the second tristate buffer comprising seventh and eighth series-connected p-channel transistors connected between the power supply and the second output node, the gate of the seventh p-channel transistor connected to receive the first drive signal, the gate of the eights p-channel transistor connected to receive a second sense signal applied to the second sense node, and seventh and eighth series-connected n-channel transistors connected between the second output node and the negative supply, the gate of the seventh n-channel transistor connected to receive the second sense signal, the gate of the eighth n-channel transistor connected to receive the second drive signal, the first and second drive signals being complementary.

* * * * *

UNITED STATES PATENT AND TRADEMARK OFFICE
CERTIFICATE OF CORRECTION

PATENT NO. : 5,231,318
DATED : July 27, 1993
INVENTOR(S) : Chitranjan N. Reddy

Page 1 of 2

It is certified that error appears in the above-identified patent and that said Letters Patent is hereby corrected as shown below:

In Col. 5, Line 7, delete "signal form" and replace with --signals, from--.

In Col. 5, Line 10, delete "tis" and replace with --its--.

In Col. 5, Line 14, delete "tis" and replace with --its--.

In Col. 5, Line 16, delete "tis" and replace with --its--.

In Col. 5, Line 29, after "responsive" delete "t" and replace with --to--.

In Col. 5, Line 32, delete "ad" and replace with --and--.

In Col. 5, Line 56, after "and" insert --a--.

In Col. 5, Line 64, after "5" insert --and--.

In Col. 6, Line 7, after "differential" insert --latch--.

In Col. 6, Line 38, delete "nodes" and replace with --node--.

In Col. 6, Line 47, delete "tis" and replace with --its--.

UNITED STATES PATENT AND TRADEMARK OFFICE
CERTIFICATE OF CORRECTION

PATENT NO. : 5,231,318
DATED : July 27, 1993
INVENTOR(S) : Chitranjan N. Reddy

It is certified that error appears in the above-indentified patent and that said Letters Patent is hereby corrected as shown below:

In Col. 7, Line 10, delete "to" and replace with --of--.

Signed and Sealed this

Eighth Day of March, 1994

Attest:

BRUCE LEHMAN

*Attesting Officer*     *Commissioner of Patents and Trademarks*